(12) United States Patent
Sung et al.

(10) Patent No.: US 10,177,026 B2
(45) Date of Patent: Jan. 8, 2019

(54) SEMICONDUCTOR STRUCTURE AND FABRICATION METHOD THEREFOR

(71) Applicant: TAIWAN SEMICONDUCTOR MANUFACTURING COMPANY, LTD., Hsinchu (TW)

(72) Inventors: Ta-wei Sung, Hsinchu (TW); Ming-Hui Li, Taichung (TW); Ming-Ying Tsai, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 15/651,167

(22) Filed: Jul. 17, 2017

(65) Prior Publication Data

US 2018/0151413 A1 May 31, 2018

Related U.S. Application Data

(60) Provisional application No. 62/427,562, filed on Nov. 29, 2016.

(51) Int. Cl.
| | |
|---|---|
| H01L 21/762 | (2006.01) |
| H01L 29/78 | (2006.01) |
| H01L 21/8234 | (2006.01) |
| H01L 21/8238 | (2006.01) |
| H01L 21/265 | (2006.01) |
| H01L 29/66 | (2006.01) |
| H01L 29/08 | (2006.01) |

(52) U.S. Cl.
CPC .. *H01L 21/76224* (2013.01); *H01L 21/26586* (2013.01); *H01L 21/823462* (2013.01); *H01L 21/823481* (2013.01); *H01L 21/823864* (2013.01); *H01L 29/0847* (2013.01); *H01L 29/66545* (2013.01); *H01L 29/7843* (2013.01)

(58) Field of Classification Search
None
See application file for complete search history.

(56) References Cited

U.S. PATENT DOCUMENTS

| | | | |
|---|---|---|---|
| 2009/0227087 A1* | 9/2009 | Ramappa | H01L 21/30625 438/460 |
| 2016/0211137 A1* | 7/2016 | Tang | H01J 37/3171 |
| 2017/0047285 A1* | 2/2017 | Cheng | H01L 23/5252 |
| 2017/0117157 A1* | 4/2017 | Chen | H01L 21/31051 |

* cited by examiner

*Primary Examiner* — Asok K Sarkar
(74) *Attorney, Agent, or Firm* — Hauptman Ham, LLP

(57) ABSTRACT

A method of fabricating a semiconductor structure. The method includes forming a sacrificial gate structure, depositing a dielectric material, and implanting the dielectric material using a silicon cluster gas. The silicon cluster gas has two or more silicon atoms.

20 Claims, 5 Drawing Sheets

SEMICONDUCTOR STRUCTURE AND FABRICATION METHOD THEREFOR

BACKGROUND

During fabrication of a semiconductor integrated circuit (IC), an inter-layer dielectric (ILD) is formed as a barrier layer between a substrate and interconnect structures. The ILD helps to prevent particles in the interconnect structures and inter-metal dielectrics (IMDs) from diffusing into the substrate and therefore reduces the risk of improper functioning of various components formed within the ILD. The ILD is etched to form openings, such as contact holes or trenches, for features which are subsequently metalized to provide a conductive path for electrical signals to connect to the various components.

In some approaches, a mono silane ($SiH_4$) or silicon tetrafluoride ($SiF_4$) gas is introduced after a formation of the ILD for a planarization purpose. For example, $SiH_4$ is ionized to generate plasma and form an ion beam with silicon atoms during an ion implantation process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
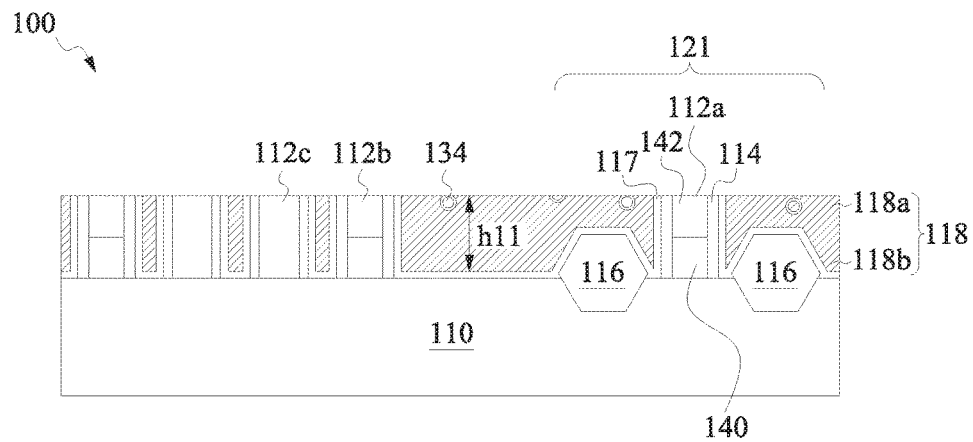
FIG. 1 is a cross-sectional view of a semiconductor structure having an inter-layer dielectric (ILD) in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technology evolves, a replacement gate architecture is used to manufacture a conductive gate structure such as a metal gate structure. A sacrificial gate structure and an inter-layer dielectric (ILD) are initially formed over a substrate. Next, the sacrificial gate structure is removed from the ILD and replaced by the conductive gate structure. The architecture provides benefits, such as no polysilicon depletion effect, increased flexibility to tune a work function based on a conductivity type of a transistor, and decreased thermal budget in a process flow design. However, due to a polishing selectivity between the sacrificial gate structure and the ILD, an undesired loss occurs at an upper portion of the ILD during a planarization process, resulting in an insufficient gate height for causing stress in a channel region of the transistor.

In some embodiments, a silicon cluster gas, such as a fluoride-substituted silane compound with two or more silicon atoms, or silanes, is used during an implantation process. In some embodiments, the silicon cluster gas is ionized and disassociated into multiple types of silicon ions to increase silicon-silicon bonds in the ILD, thereby strengthening the ILD during the subsequent planarization process and enhancing wafer per hour (WPH) throughput. In some embodiments, the implantation process is performed at a temperature higher than a room temperature (e.g., from about 15 degrees Celsius to about 30 degrees Celsius) to drive the silicon ions into the ILD. In some embodiments, the implantation process is performed at or below room temperature and followed by a thermal process to diffuse the silicon ions into the ILD. In a subsequent planarization process, due to a relatively low polishing resistance, an ILD loss occurs at a top surface of the ILD and causes a dish-shaped recess, also referred to as a dishing effect. In some embodiments, after a removal process of a gate dielectric layer, a dishing at a top surface of the ILD is reduced, resulting in a higher gate height and fewer manufacturing cost compared with a conventional structure.

FIG. 1 is a cross-sectional view of a semiconductor structure 100 in accordance with one or more embodiments. Semiconductor structure 100 includes a transistor 121 over a substrate 110. In some embodiments, transistor 121 is a fin field effect transistor (FinFET). In some embodiments, transistor 121 is a planar metal-oxide-semiconductor field effect transistor (MOSFET). Other transistor structures and analogous structures, such as a tri-gate field effect transistor, a gate-all-around field effect transistor, a nanowire or tunneling field effect transistor, are within the contemplated scope of this description. Transistor 121 includes a gate structure 112a, spacers 114 adjoining on sidewalls of gate structure 112a, and source/drain features 116 at opposite sides of gate structure 112a. In some embodiments, an etch stop layer 117 is over gate structures 112a-c, spacers 114 and source/drain features 116. Gate structure 112a includes a conductive layer 140, a planarization dielectric layer 142, and a dielectric layer (not shown) between conductive layer 140 and substrate 110. Conductive layer 140, planarization dielectric layer 142 and the dielectric layer determine a gate height h11. Semiconductor structure 100 also includes a poly cutting structure 112c. Poly cutting structure 112c includes a dielectric layer adjoined by spacers 114. An ILD 118 is formed over substrate 110. In some embodiments, ILD 118 includes silicon oxide, borophosphosilicate glass (BPSG), borosilicate glass (BSG), carbon doped low-k dielectric materials, or the like. ILD 118 has a thickness equal to gate height h11. An upper portion 118a of ILD 118 includes a higher concentration of silicon atoms 134 than a lower portion 118b of ILD 118. In some embodiments, a thickness ratio of lower portion 118b to upper portion 118a ranges from about 3.5:1 to about 5.5:1. A greater ratio provides insufficient silicon atoms to endure a planarization process, in some instances. A smaller ratio damages gate structures, in some instances. In at least one embodiment, a silicon atom concentration ratio of upper portion 118a to lower portion 118b is equal to or greater than 1000:1.

Figure 2:
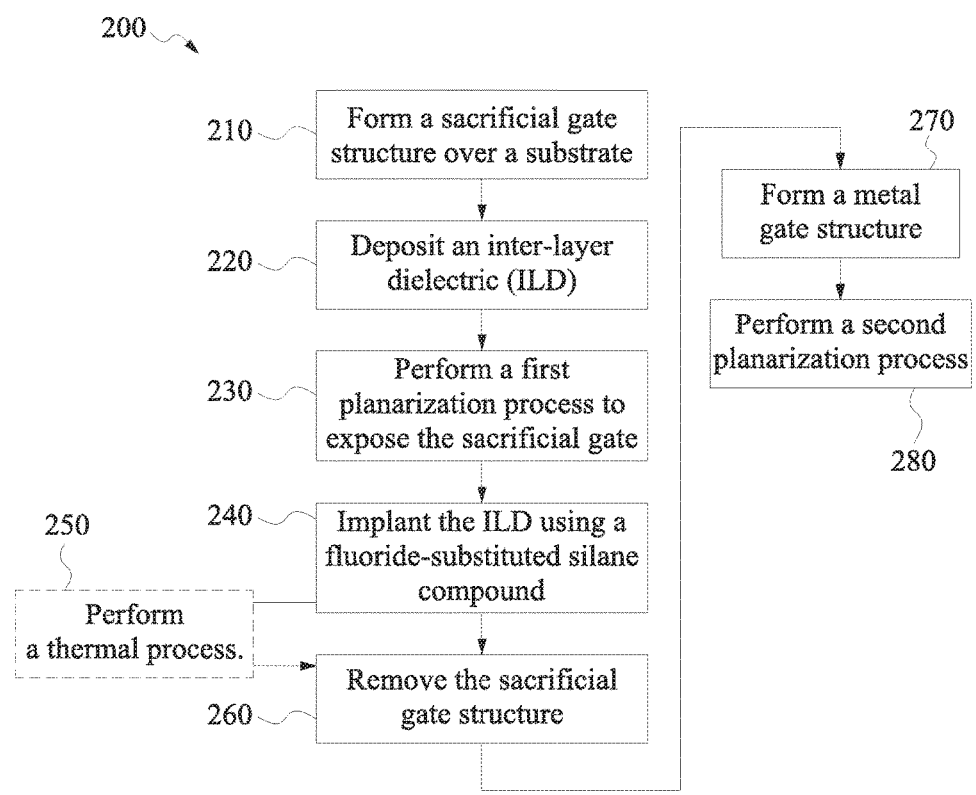
FIG. 2 is a flow chart of a method of fabricating a semiconductor structure in accordance with one or more embodiments.

FIG. 2 is a flow chart of a method 200 of fabricating a semiconductor structure in accordance with one or more embodiments. One of ordinary skill in the art would understand that additional operations are able to be performed before, during, and/or after method 200 depicted in FIG. 2, in some embodiments. Method 200 includes operation 210 in which a sacrificial gate structure is formed over a substrate. In some embodiments, the substrate is a planar substrate. In some embodiments, the substrate is a semiconductor strip, also called a fin, extending from a semiconductor workpiece. In some embodiments, the substrate includes silicon, silicon-germanium, silicon-carbide or III-V compound. In some embodiments, the substrate is a silicon on insulating layer (SOI) substrate or a silicon on sapphire (SOS) substrate.

In a "gate last" architecture in which a final gate structure is fabricated "last," the sacrificial gate structure is initially formed and subsequently replaced by another material until a manufacturing of the ILD. Afterwards, based on the integrated circuit design, the sacrificial gate structure is manufactured to be a functional gate structure or a nonfunctional gate structure. In some embodiments, the sacrificial gate structure includes an oxide layer and/or a polysilicon layer. Therefore, the sacrificial gate structure is also called a dummy poly structure or a dummy gate structure. In some embodiments, the sacrificial gate structure includes a hard mask layer formed above the polysilicon layer. The formation of the sacrificial gate structure includes a deposition process and an etch process.

Figure 3A:
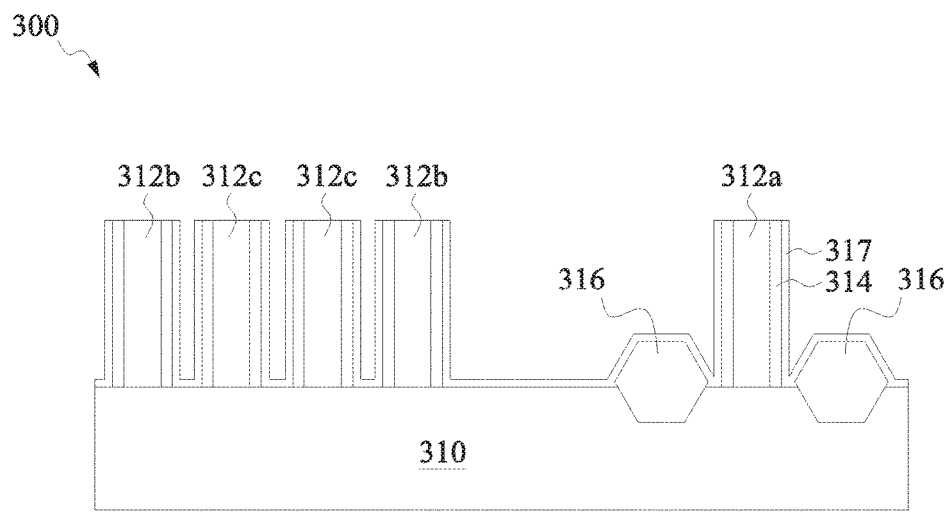
FIGS. 3A-3H are cross-sectional views at various stages of fabrication of a semiconductor structure in accordance with one or more embodiments.

FIG. 3A is a cross-sectional view of a semiconductor structure 300 following operation 210 in accordance with one or more embodiments. Semiconductor structure 300 is similar to semiconductor device 100, like elements have a same reference number increased by 200. Semiconductor structure 300 includes a substrate 310, a plurality of sacrificial gate structures 312a-c, spacers 314 and source/drain features 316. Substrate 310 is a semiconductor workpiece with a planar top surface. Alternatively, substrate 310 is a fin structure formed over a workpiece. When substrate 310 is a fin structure, in some embodiments, substrate 310 is made of a same material as the workpiece. In some embodiments, substrate 310 is made of a different material from the workpiece.

After a die-packaging process is completed, a replacement gate electrode of sacrificial gate structure 312a is used perform a logic function, such as turning on/off a transistor, a replacement gate electrode sacrificial gate structure 312b, which is arranged on at least one side of sacrificial gate structure 312a, is used to protect the functional gate electrode, and sacrificial gate structure 312c will be removed to disconnect gate electrodes from one another. Spacers 314 are on a top surface of substrate 310 and along sidewalls of sacrificial gate structures 312a-c. Spacers 314 are used as a mask for lightly doped drain (LDD) implantation to help avoid hot carrier injection (HCI). In some embodiments, spacers 314 include a dielectric material, such as silicon oxide, silicon nitride, or another suitable material. In some embodiments, spacers 314 include multiple materials, for example, an oxide-nitride-oxide (ONO) structure. When a hard mask layer is formed over the polysilicon layer, spacers 314 include a different dielectric material than the hard mask layer. In various embodiments, spacers 314 are deposited and then patterned by performing an isotropic or an anisotropic etch process to have a D-shape, I-shape or L-shape. Source/drain features 316 are at opposite sides of sacrificial gate structure 312a. In some embodiments, source/drain features 316 are doped regions with an n-type dopant or a p-type dopant. In some embodiments, source/drain features 316 are an epitaxial material grown in a recess in substrate 310. In some embodiments, source/drain features 316 are a doped epitaxial material.

Method 200 continues with operation 220 in which an ILD is deposited over the substrate. In some embodiments, an etch stop layer, such as a contact etch stop layer (CESL), is formed along the substrate, sacrificial gate structures, spacers and source/drain features. Afterward, the ILD is formed over the etch stop layer and between the sacrificial gate structures. The formation of the ILD is followed by a planarization process, such as a chemical mechanical polishing (CMP) process, an etch process, or another suitable process to produce a planar top surface for the ILD. The planar top surface helps increase precision for a subsequent lithography process(es). In some embodiments, a mask layer is formed over the ILD and then patterned to define a poly cutting pattern for poly removal. Next, a dielectric layer is deposited to fill an opening after the poly removal and over the mask layer.

Figure 3B:
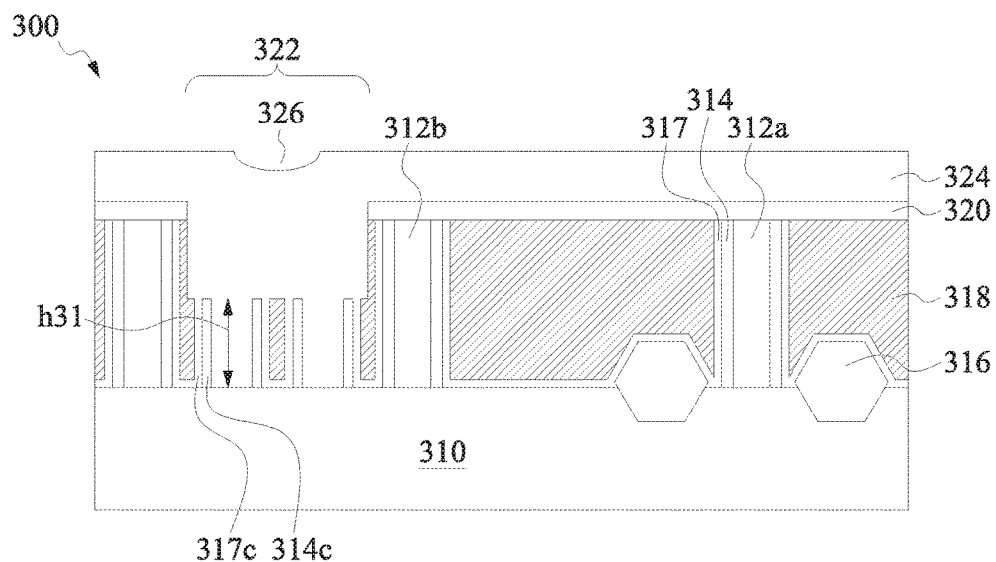

FIG. 3B is a cross-sectional view of semiconductor structure 300 following operation 220 in accordance with one or more embodiments. An ILD 318 is deposited over substrate 310, sacrificial gate structures 312a-c, spacers 314 and source/drain features 316. In some embodiments, ILD 318 includes a dielectric material such as silicon oxide, silicon nitride, undoped silicate glass (USG), Boro-Silicate Glass (BSG), tetraethyl orthosilicate (TEOS), other suitable materials, and/or combination thereof. In some embodiments, ILD 318 includes a low dielectric constant (low-k) material, for example, a dielectric constant lower than 3. In some embodiments, ILD 318 includes an extreme low-k (ELK) material, for example, a dielectric constant lower than 2.6. In some embodiments, based on a height of sacrificial gate structures 312a-c. ILD 318 has a thickness ranging from about 85 nanometers (nm) to about 500 nm. A smaller thickness results in an insufficient coverage on sacrificial gate structures 312a-c, in some instances. A greater thickness increases a cost of manufacturing without a significant enhancement in functionality, in some instances. The formation of ILD 318 includes chemical vapor deposition (CVD), physical vapor deposition (PVD), high density plasma (HDP) deposition, spin-on deposition (SOD), other suitable processes, and/or combination thereof. In some embodiments, an etch stop layer 317 is formed prior to the deposition of OLD 318 by using CVD, PVD, HDP, SOD, atomic layer deposition (ALD) or other suitable process. In some embodiments, ILD 318 is planarized to be coplanar with a top surface of sacrificial gate structures 312a-c. In some embodiments, ILD 318 is planarized by using the CMP to remove portions of ILD 318 over sacrificial gate structures 312a-c as well as other sacrificial gate structures on an insulating region, such as a shallow trench isolation (STI). In some embodiments, the CMP is applied to remove etch stop layer 317 above sacrificial gate structures 312a-c to expose the polysilicon layer or the hard mask layer.

In some embodiments, due to the reduction of pitch of gate structures, an increased density design rule for parallel gate electrodes is applied. Under the increased density design rule, for example, a spacing for a well pickup region, which is used to discharge an ESD current to protect the transistor, between adjacent gate structures is limited and an area penalty increases when adjacent gate structures are separated too far away from each other. The area penalty is a ratio of an additional area occupation to the initially designed area occupation. In some embodiments, due to a lower pattern fidelity on a wafer to photomask patterns and a lower process window of a smaller chip dimension, a wider end of a gate structure also increases area occupation. Therefore, in order to save the area occupation, sacrificial gate structures 312a-c are initially arranged based on the design rule.

Next, by using a mask layer 320, an opening, also called a poly cutting pattern 322 is defined and undesired sacrificial gate structure 312c is exposed. An entirety of polysilicon layer of sacrificial gate structure 312c, a portion of spacers 314c, a portion of etch stop layer 317c and ILD 318 exposed through poly cutting pattern opening (CPO) 322 are removed by a CMP or an etch process.

After the removal process, a remaining portion of spacers 314c and/or a remaining portion of etch stop layer 317c has a height h31. In order to prevent unwanted current leakage, a filling material 324 is formed to fill the opening and cover a top surface of mask layer 320. Filling material 324 includes one or multiple dielectric materials, such as silicon oxide, silicon nitride, silicon oxynitride, silicon carbide, USG, TEOS, other suitable materials, and/or combination thereof. In some embodiments, filling material 324 includes a same material as ILD 318. In some embodiments, filling material 324 includes a different material from ILD 318. In some embodiments, a recess 326 is formed corresponding to poly cutting pattern opening 322.

Returning to FIG. 2, method 200 continues with operation 230 in which a first planarization process is performed to expose the sacrificial gate. The first planarization process includes a CMP process. In some embodiments, a recess formed in the ILD disappears during the first planarization process.

Figure 3C:
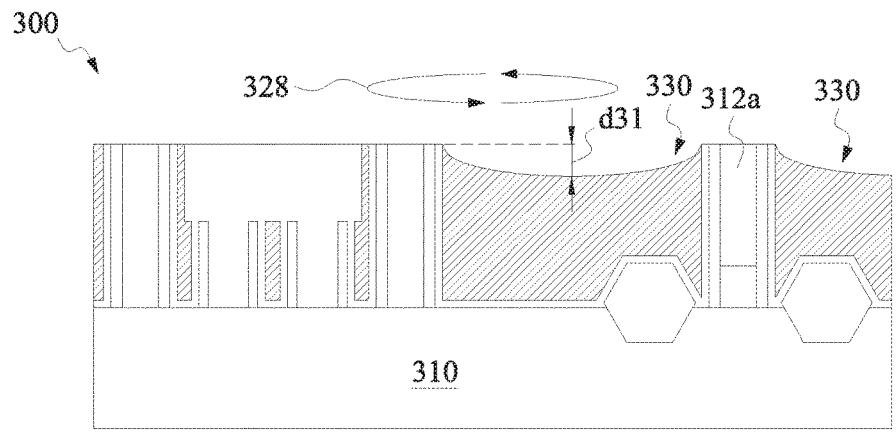

FIG. 3C is a cross-sectional view of semiconductor structure 300 in accordance with one or more embodiments. In order to perform the gate replacement, a first planarization process 328 is performed to remove an excess portion of ILD 318 and an entirety of mask layer 320 until the polysilicon layer of sacrificial gate structures 312a-c are exposed. During first planarization process 328, because a slurry has a higher selectivity of ILD 318, a dishing 330 is formed at a top surface of ILD 318. Dishing 330 has a maximum depth d31 ranging from about 1 nm to about 6 nm. A greater maximum depth d31 increases a loss of ILD 318 in the subsequent process and results in an insufficient gate height for a stress in a channel region, in some instances.

Returning to FIG. 2, method 200 continues with operation 240 in which the ILD is implanted using a fluoride-substituted silane compound. In order to enhance the implantation efficiency and reduce the processing time, a dopant gas including at least two silicon atoms is selected. As a result, an implanting time reduces and WPH throughput increases. In some embodiments, an apparatus comprises an ionization chamber, and an electron beam source device inside the ionization chamber. The electron beam source device comprises a field emission array having a plurality of emitters for generating electrons in vacuum under an electric field. In some embodiments, the electron source device further includes a cathode. Electrons collide with the dopant gas inside the ionization chamber to ionize the dopant molecules to generate plasma. The plasma includes dopant ions, which are extracted through an extraction apparatus to form an ion beam. In some embodiments, the dopant gas is a silicon cluster gas. In some embodiments, the dopant gas is $Si_xF_y$, or $Si_xH_y$, wherein x is an integer ranging from 2 to 4 and y is 2x+2. In some embodiments, the dopant gas is $Si_xH_yF_z$, wherein x ranges from 2 to 4 and (y+z) is 2x+2. In some embodiments, a dosage of the dopant gas ranges from about 8E15 atoms/cm$^2$ to about 1.5E16 atoms/cm$^2$. In some embodiments, a dopant weight concentration is in a range from about 0.01% to about 100%. The selected silicon cluster includes more silicon-based ion in comparison with other approaches. Due to two or more silicon atoms, the silicon clusters fragment into smaller silicon clusters. For example, dopant gas $Si_2F_6$ generates two types of silicon ions ($Si^+$ and $Si_2^+$), resulting in a doubled source beam in comparison with the other approaches. The more silicon atoms, the greater source beam and the less implantation processing time. In some embodiments, the implantation process is performed at a temperature in a range from about 150 degrees Celsius to about 450 degrees Celsius to drive silicon ions into the ILD. In some embodiments, the implantation process is performed at or below room temperature and followed by a thermal process to achieve a similar effect.

In some embodiments, implantation process 322 is performed by implantation equipment, such as a high current implanter, a medium current implanter, and/or a high energy implanter. Exemplary implantation systems include those provided by Advance Ion Beam Technology (AIBT) of Fremont, Calif. (including AIBT's "iPulsar" system); Varian Semiconductor Equipment Associates of Massachusetts (including Varian's Trident™, 900XP, or 3000XP systems); and Axcelis Technologies of Massachusetts (including Axcelis' HE3 or Optima XE system).

Figure 3D:
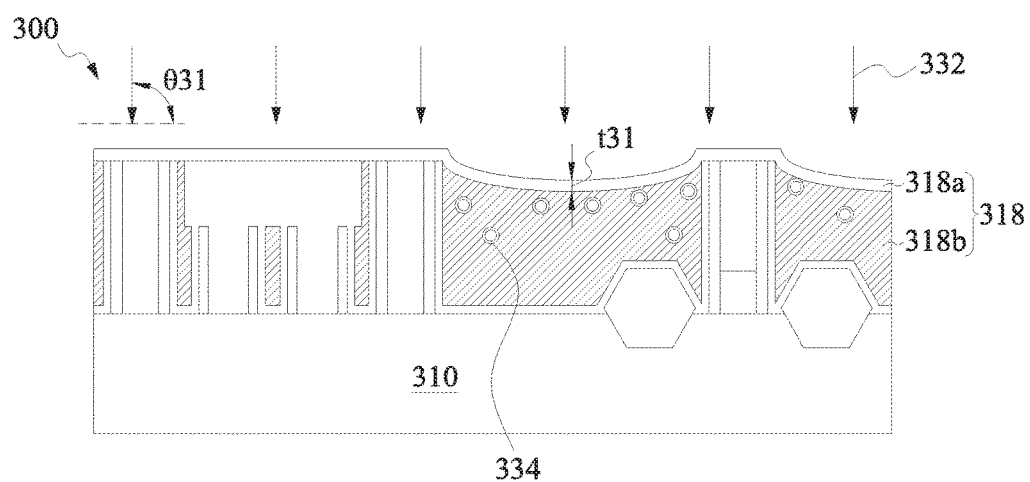

FIG. 3D is a cross-sectional view of semiconductor structure 300 in accordance with one or more embodiments. In the gate last architecture, the polysilicon layer and/or the oxide layer are removed for the gate replacement. In some instances, because gate structures in a more dense region have a different gate height than in a less dense region, a significant gate height loss occurs during the removal process, resulting in device defects such as power shorting or metallic diffusion. Therefore, in order to reduce the gate height loss, after first planarization process 328, an implantation process 332 is performed to increase silicon-silicon bonds of silicon atom 334 in ILD 318, thereby lessening an etch rate with respect to ILD 318. In at least one embodiment, an upper portion 318a of ILD 318 has a higher concentration of silicon atom 334 than a lower portion 318b of ILD 318. A ratio of a thickness of lower portion 318b to a thickness of upper portion 318a ranges from about 20 to 200. A greater or smaller ratio increases a difficulty of controlling the subsequent planarization process. In some embodiments, ILD 318 has a gradient silicon concentration in a direction orthogonal to the top surface of ILD 318. In some embodiments, upper portion 318a has a thickness t31 ranging from about 25 angstrom (Å) to about 75 Å. A smaller thickness t31 causes the silicon-silicon bonds to be insufficient to lessen the gate height loss, in some instances. A greater thickness t31 increases a production unit cost, in some instances.

During implantation process 332, the silicon ions are directed toward the top surface of ILD 318 vertically or tiled at an angle θ31 relative to the top surface of ILD 318 ranging from about 45 degrees to about 90 degrees. Smaller angle θ31 results in too small thickness t31 to reduce the gate height loss; otherwise, in order to maintain thickness t31, increased implantation energy will damage semiconductor structure 300, in some instances. The implantation energy is adjusted based on angle θ31. For example, when θ31 is 90 degrees, the energy ranges from about 1,800 electron volts (eV) to about 2,200 eV. A smaller energy causes thickness t31 to be too small to reduce the gate height loss, in some instances. A greater energy damages semiconductor structure 300, in some instances. In some embodiments, a temperature of implantation process 332 ranges from about 150 degrees Celsius to about 450 degrees Celsius, lasting for a period from about 300 seconds to about 600 seconds. As one example, an electrostatic chuck (e-chuck) is used to hold semiconductor structure 300 and control the temperature during implantation process 332. In some embodiments, the temperature of implantation process 332 is around room temperature and a subsequent thermal process is performed to drive silicon atoms downwardly. Implantation process 332 is performed by a blanket implantation. In some embodiments, the silicon ions are implanted into the top surface of sacrificial gate structure 312a-b, the top surface of filling material 324 and the top surface of ILD 318. In some embodiments, the silicon ions are specifically implanted into the top surface of ILD 318 by using a photoresist.

In some embodiments, implantation process 332 uses a plasma doping. Because the plasma ions in a plasma sheath could move in different directions, not just directed toward the substrate as is the case for the dopants from ion beams, plasma ions often have lower energy than the ions of ion beams. Therefore, the plasma doping has higher surface concentration with a more rapid decrease in dopant concentration with depth, which indicates better depth control for shallow doping. As a result, in some embodiments, plasma doping is used for shallower thickness t31.

Returning to FIG. 2, method 200 continues with optional operation 250 in which a thermal process is performed. When the implantation process is performed at or below room temperature (e.g., from about 15 degrees Celsius to about 30 degrees Celsius), the thermal process helps to drive the silicon ions into the ILD. In some embodiments where the implantation process is performed at a temperature around 300 degrees Celsius, the thermal process still provides an improvement for silicon-silicon bonds.

Figure 3E:
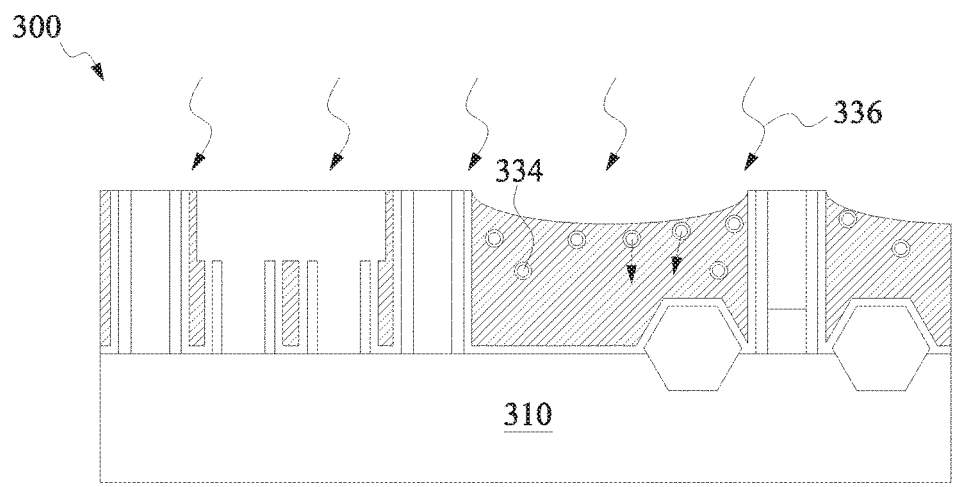

FIG. 3E is a cross-sectional view of semiconductor structure 300 in accordance with one or more embodiments. A thermal process 336 is performed to drive silicon atoms more deeply into ILD 318. Further, thermal process 335 helps to increase silicon-silicon bond in ILD 318, resulting a lower etch rate of ILD 318. In some embodiments, thermal process 336 includes a plasma treatment, a laser anneal or a rapid anneal. In some embodiments, thermal process 336 is performed at a temperature ranging from about 150 degrees Celsius to about 450 degrees Celsius. A higher temperature reduces a thermal budget in the semiconductor manufacturing. In some embodiments, based on the operating temperature, thermal process 336 is performed from about 300 seconds to about 600 seconds.

Returning to FIG. 2, method 200 continues with operation 260 in which the sacrificial gate structure is removed. The removal process includes a planarization process, such as CMP, or an etch process, such as a wet etching. In some embodiments, the oxide layer and the polysilicon layer of the sacrificial gate structure are removed. In some embodiments, the oxide layer remains. In some embodiments, the oxide layer includes silicon dioxide. In some embodiments, the oxide layer is a high dielectric constant (high-k) material higher than that of silicon dioxide, such as such as $HfO_2$, $TiO_2$, HfZrO, $Ta_2O_3$, $HfSiO_4$, $ZrO_2$, $ZrSiO_2$, and/or other suitable materials.

Figure 3F:
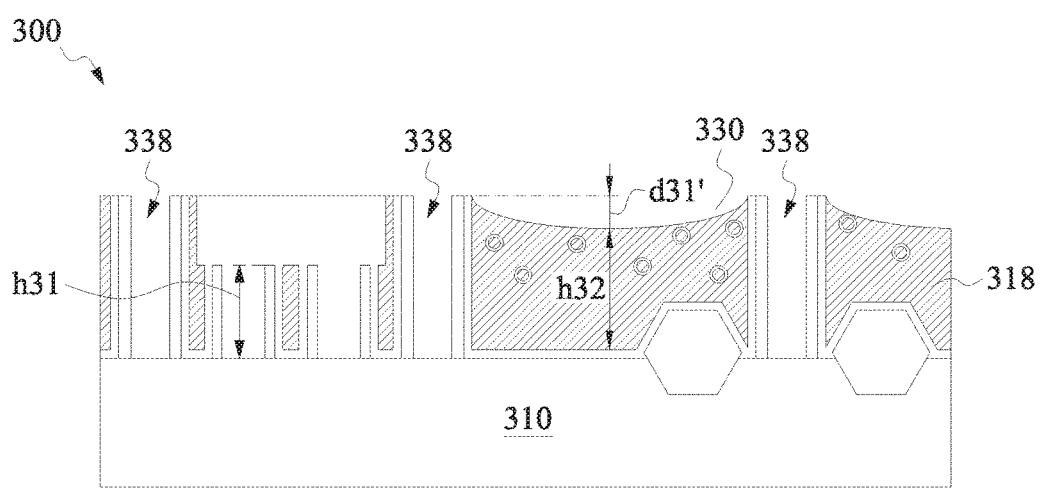

FIG. 3F is a cross-sectional view of semiconductor structure 300 following operation 260 in accordance with one or more embodiments. In some embodiments, the polysilicon layer and/or the hard mask layer is selectively removed from sacrificial gate structures 312a-b. The selective removal process provides trenches 338 within which a conductive gate structure will be subsequently formed. In some embodiments, sacrificial gate structures 312a-b are removed by using a wet etching, a dry etching, or a combination thereof. In some embodiments, the wet etching process includes exposure to a hydroxide containing solution (e.g., ammonium hydroxide), deionized water, and/or other suitable etchant solutions. In some embodiments, when the oxide layer of sacrificial gate structure 312a-b is silicon dioxide, the oxide layer is removed from the trenches by using a buffered oxide etchant (BOE) after the removal of the gate electrode. In some embodiments, the removal process uses a slurry having a higher etch rate with respect to sacrificial gate structure 312a-b then that of ILD 318. However, a portion of ILD 318 is removed and causes dishing 330 to have a deeper depth d31' in a range from about 1 nm to about 12 nm. In comparison with the other approach, less ILD 318 is removed and therefore shallower depth d31' is caused. A height h32 is defined by a distance from a bottom portion of dishing 330 to a top surface of substrate 310. Due to the reduced etch rate, height h32 is greater than height h31.

Returning to FIG. 2, method 200 continues with operation 270 in which a conductive gate structure is formed. After removing the sacrificial gate structure, a conductive material is deposited to fill the trench in the ILD. When the oxide layer of the sacrificial gate structure is removed, a high-k material is deposited prior to the formation of conductive material.

Figure 3G:
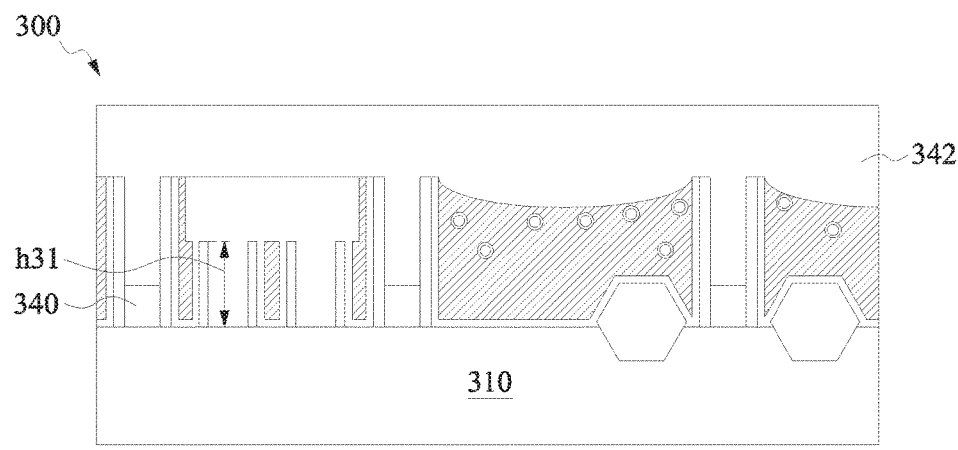
Figure 3H:
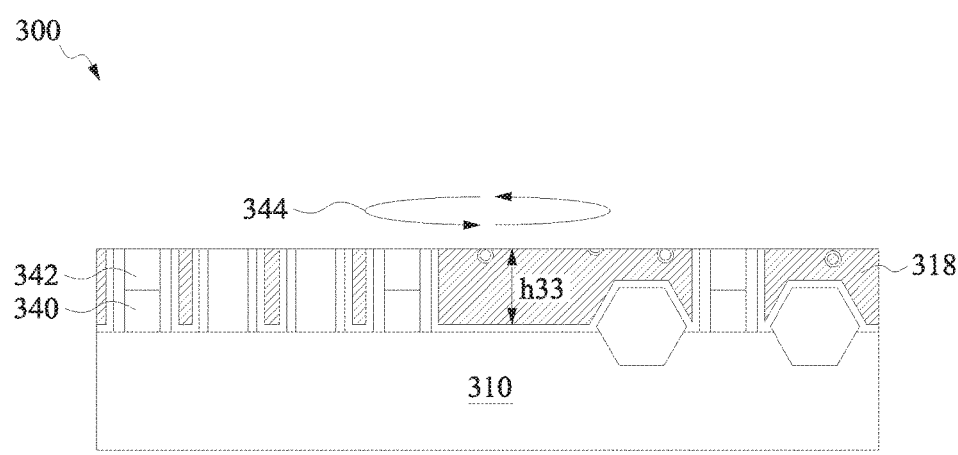

FIG. 3G is a cross-sectional view of semiconductor structure 300 in accordance with one or more embodiments. A conductive gate structure 340 is formed in trenches 338. The formation of conductive gate structure 340 includes a deposition process, such as PVD. In some embodiments, conductive gate structure 340 includes a multilayer structure. In some embodiments, conductive gate structure includes an interfacial layer used to arrange a good interface between a silicon surface (i.e. the top surface of substrate 310) and a gate insulator, for example, a high-k material, such as $HfO_2$, $HfSiO_4$, $ZrO_2$ or $ZrSiO_4$, and to suppress the mobility degradation of channel carriers. In some embodiments, the high-k material has a thickness ranging from about 5 Å to about 30 Å. A smaller high-k material induces a large leakage current in a transistor, in some instances. A greater thickness results in a short channel effect, in some instances. Next, a conductive material is deposited within a cavity defined by the interfacial layer and the high-k material. In some embodiments, the conductive material is tungsten. In some embodiments, the conductive material includes different materials such as titanium, nickel, or tantalum, and has a work function suitable for a p-type transistor or an n-type transistor.

Next, a sacrificial dielectric material 342 is formed over ILD 318 and fills trenches 338. In some embodiments, sacrificial dielectric material 342 fills into dishing 330 and vacancies in trenches 338 and is configured to function as a hard mask layer during a subsequent planarization process. In some embodiments, sacrificial dielectric material 342 is used to reduce a risk of further dishing during a subsequent planarization process.

Returning to FIG. 2, method 200 continues with operation 280 in which a second planarization process is performed. A second planarization process is performed to remove excess sacrificial dielectric material over the conductive gate structure. In some embodiments, the sacrificial dielectric material includes a same dielectric material as the filling material. In some embodiments, the sacrificial dielectric material includes a different dielectric material from the filling material. In some embodiments, the second planarization process stops at a bottom portion of the dishing. In some embodiments, the second planarization process stops at a top portion of spacers within the poly cutting region.

FIG. 3G is a cross-sectional view of semiconductor structure 300 following operation 270 in accordance with one or more embodiments. A second planarization process 344 is performed until dishing 330 (best seen in FIG. 3F) disappears. In some embodiments, second planarization process 344 is a CMP. In some embodiments, second planarization process 344 is an etch process, such as a wet etching, a dry etching or a combination thereof. In some embodiments, when conductive gate structure 340 is substantially filled in trenches 338, second planarization process 344 removes all of sacrificial dielectric material 342 over dishing 330 until a planar top surface of ILD 318 is reached. A gate height h33 is defined after second planarization process 344. In comparison with other approaches, gate height h33 is higher while ILD 318 still has a uniformly planar top surface. One of ordinary skill in the art would understand that, due to the process and/or manufacturing, planar surface may vary within normal tolerances. In some embodiments, gate height h33 ranges from about 850 angstrom (Å) to about 1050 Å. A shorter gate height h33 reduces a stress in a channel region of a transistor, in some instances.

In some embodiments, additional operations are included in method 200, such as forming conductive structure 340 is separated based on a conductivity type of a transistor. In embodiments, method 200 may continue to include additional operations such as formation of contacts, interconnect structures (e.g., lines and vias, metal layers, and interlayer dielectric that provide electrical interconnection to the device including the formed metal gate) and deposition of passivation layers. In some embodiments, an order of operations for method 200 is modified. For example, the removal of polysilicon from sacrificial gate structure 312c is performed before the formation of spacers 314.

By using the silicon cluster gas, more silicon-silicon bonds are generated in the ILD, especially the upper portion of the ILD, to reduce the etch rate of the ILD. Therefore, the ILD loss decreases and the gate height increases. Because the silicon cluster gas produces at least doubled silicon ions during the implantation process, the production unit cost reduces and WPH throughput increases. Further, the less processing time helps prevent particle from contaminating the wafer, thereby improving the production yield.

One aspect of this description relates to a method of fabricating a semiconductor structure. The method includes forming a sacrificial gate structure, depositing a dielectric material, and implanting the dielectric material using a silicon cluster gas. The silicon cluster gas has two or more silicon atoms.

Another aspect of this description relates to a method of manufacturing a semiconductor device. The method includes forming a first sacrificial gate structure over a substrate, forming a second sacrificial gate structure over the substrate, depositing an inter-layer dielectric (ILD) over the substrate and between the first sacrificial gate structure and the second sacrificial gate structure, removing the second sacrificial gate structure and a portion of the ILD to form an opening, filling the opening with a first dielectric material, performing a first planarization process, performing a gas cluster ion beam implantation process, wherein the gas cluster includes $Si_xF_y$, x being equal to or greater than 2 and y being equal to or greater than 6, and performing a second planarization process.

Still another aspect of this description relates to a semiconductor structure. The semiconductor structure includes a gate structure over a substrate, and an inter-layer dielectric (ILD) over the substrate. An upper portion of the ILD has a higher concentration of silicon atom than a bottom portion of the ILD.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   forming a sacrificial gate structure;
   depositing a dielectric material; and
   implanting the dielectric material using a silicon cluster gas, wherein the silicon cluster gas has two or more silicon atoms, and implanting the dielectric material comprises an angle of an implantation direction relative to a top surface of the dielectric material ranging from about 45 degrees to about 90 degrees.

2. The method of claim 1, wherein implanting the dielectric material comprises:
   forming a gradient concentration of silicon atom in the dielectric material, wherein an upper portion of the dielectric material has a higher concentration of silicon atom than a lower portion of the dielectric material.

3. The method of claim 1, wherein implanting the dielectric material comprises using a fluoride-substituted silane compound.

4. The method of claim 1, further comprises:
   removing the sacrificial gate structure;
   forming a metal gate structure; and
   performing a planarization process, wherein a depth of a dishing ranges from about 1 nanometer (nm) to about 12 nm.

5. The method of claim 1, wherein implanting the dielectric material comprises an energy ranging from about 1,800 electron volts (eV) to about 2,200 eV and a dosage ranging from about 8E15 atoms/cm$^2$ to about 1.5E16 atoms/cm$^2$.

6. The method of claim 1, wherein implanting the dielectric material comprises a temperature ranging from about 150 degrees Celsius to about 450 degrees Celsius.

7. The method of claim 1, wherein implanting the dielectric material comprises a temperature ranging from about 10 degrees Celsius to about 20 degrees Celsius.

8. The method of claim 7, further comprising:
performing a thermal process at a temperature ranging from about 150 degrees Celsius to about 450 degrees Celsius.

9. The method of claim 1, further comprising:
depositing a mask layer over the dielectric material and the sacrificial gate structure;
removing a portion of the mask layer to define an opening by using a cutting pattern;
removing a portion of the dielectric material and the sacrificial gate structure in the opening;
depositing a filling layer; and
performing another planarization process to expose a top surface of the sacrificial gate structure.

10. The method of claim 1, wherein the implanting of the dielectric material comprises using multiple species of silicon cluster gas.

11. A method of manufacturing a semiconductor device, comprising:
forming a first sacrificial gate structure over a substrate;
forming a second sacrificial gate structure over the substrate;
depositing an inter-layer dielectric (ILD) over the substrate and between the first sacrificial gate structure and the second sacrificial gate structure;
removing the second sacrificial gate structure and a portion of the ILD to form an opening;
filling the opening with a first dielectric material;
performing a first planarization process;
performing a gas cluster ion beam implantation process, wherein the gas cluster includes $Si_xF_y$, x being equal to or greater than 2 and y being equal to or greater than 6; and
performing a second planarization process.

12. The method of claim 11, wherein performing the gas cluster ion beam implantation process comprises an energy ranging from about 1,800 electron volts (eV) to about 2,200 eV and a dosage ranging from about 8E15 atoms/cm$^2$ to about 1.5E16 atoms/cm$^2$.

13. The method of claim 11, wherein performing the gas cluster ion beam implantation process comprises a temperature ranging from about 150 degrees Celsius to about 450 degrees Celsius.

14. The method of claim 11, further comprising:
annealing the implanted ILD at a temperature ranging from about 150 degrees Celsius to about 450 degrees Celsius, wherein performing the gas cluster ion beam implantation process comprises a temperature ranging from about 10 degrees Celsius to about 20 degrees Celsius.

15. The method of claim 14, wherein annealing the implanted ILD comprises a time period ranging from about 5 seconds to about 60 seconds.

16. The method of claim 11, wherein performing the gas cluster ion beam implantation process comprises increasing silicon-silicon bonds at an upper portion of the ILD with a thickness ranging from about 25 angstrom (Å) to about 75 Å.

17. The method of claim 11, further comprising:
removing the first sacrificial gate structure;
forming a first metal gate structure; and
depositing a second dielectric material over the first metal gate structure.

18. A method of fabricating a semiconductor structure, comprising:
forming a gate structure over a substrate;
depositing a first dielectric material over the substrate and the gate structure;
implanting the first dielectric material using a silicon cluster gas, wherein the silicon cluster gas has two or more silicon atoms;
depositing a second dielectric material over the first dielectric material including the implanted silicon ions; and
planarizing the second dielectric material.

19. The method of claim 18, wherein the planarizing of the second dielectric material comprises removing an entirety of the second dielectric material over the first dielectric material.

20. The method of claim 18, wherein the planarizing of the second dielectric material comprises removing a portion of the first dielectric material below the second dielectric material.

* * * * *